United States Patent
Wong et al.

(10) Patent No.: US 10,355,604 B2
(45) Date of Patent: Jul. 16, 2019

(54) CONTROL CIRCUIT AND CONTROL METHOD FOR SWITCH CIRCUIT AND SWITCHING-MODE POWER SUPPLY CIRCUIT

(71) Applicant: JOULWATT TECHNOLOGY (HANGZHOU) CO., LTD., Hangzhou (CN)

(72) Inventors: Pitleong Wong, Hangzhou (CN);
Siopang Chan, Hangzhou (CN);
Yuancheng Ren, Hangzhou (CN);
Xunwei Zhou, Hangzhou (CN)

(73) Assignee: JOULWATT TECHNOLOGY (HANGZHOU) CO., LTD., Hangzhou (CN)

( * ) Notice: Subject to any disclaimer, the term of this patent is extended or adjusted under 35 U.S.C. 154(b) by 0 days.

(21) Appl. No.: 15/690,271

(22) Filed: Aug. 29, 2017

(65) Prior Publication Data
US 2018/0062526 A1 Mar. 1, 2018

(30) Foreign Application Priority Data
Aug. 31, 2016 (CN) .......................... 2016 1 0780506

(51) Int. Cl.
*H02M 3/335* (2006.01)
*H02M 1/096* (2006.01)
*H02M 1/36* (2007.01)
*H03K 17/042* (2006.01)
*H02M 3/156* (2006.01)
(Continued)

(52) U.S. Cl.
CPC ....... *H02M 3/33523* (2013.01); *H02M 1/096* (2013.01); *H02M 1/36* (2013.01); *H02M 3/156* (2013.01); *H03K 17/04206* (2013.01); *H02M 2001/0009* (2013.01); *H02M 2003/072* (2013.01)

(58) Field of Classification Search
CPC ...... H02M 3/158; H02M 3/156; H02M 3/155; H02M 3/157; H02M 3/1563
USPC ................................ 323/222, 271, 282–285
See application file for complete search history.

(56) References Cited

U.S. PATENT DOCUMENTS

| | | | | |
|---|---|---|---|---|
| 7,042,203 B2* | 5/2006 | Van Der Horn | ...... | H02M 3/156 323/225 |
| 2008/0067993 A1* | 3/2008 | Coleman | ................. | H02M 1/08 323/282 |

(Continued)

*Primary Examiner* — Nguyen Tran
(74) *Attorney, Agent, or Firm* — Muncy, Geissler, Olds & Lowe, P.C.

(57) ABSTRACT

The present invention provides a control circuit and a control method for a switch circuit and a switching-mode power supply circuit. The control method comprises following steps: detecting an output voltage or an output current, and adjusting an upper limit value and a lower limit value of an inductor current according to a result of comparing the output voltage or the output current with the corresponding reference; and sampling the inductor current, and controlling a main switch transistor in the circuit to be switched off when a sampling current rises to the upper limit value, and controlling the main switch transistor to be switched on when the sampling current drops to the lower limit value. In the present invention, the inductor current is fast in response without overshoot, the output voltage drops very little, there is no overshoot in a process of voltage recovery, and circuit transient response is fast.

13 Claims, 10 Drawing Sheets

(51) Int. Cl.
*H02M 1/00* (2006.01)
*H02M 3/07* (2006.01)

(56) References Cited

U.S. PATENT DOCUMENTS

2014/0152243 A1* 6/2014 Xu .......................... H02J 7/007
                                                        320/107
2015/0326102 A1* 11/2015 Radhakrishnan ....... H02M 1/00
                                                        323/271

* cited by examiner detect an output voltage or an output current in a circuit, and increase an upper limit value and a lower limit value of an inductor current when the output voltage is lower than a preset reference voltage or the output current is lower than a preset reference current; and decrease the upper limit value and the lower limit value of the inductor current when the output voltage is higher than the preset reference voltage or the output current is higher than the preset reference current ⎯ S100 sample the inductor current in the circuit to obtain a sampling current, control a main switch transistor in the circuit to be switched off when the sampling current rises to the upper limit value of the inductor current, and control the main switch transistor to be switched on when the sampling current drops to the lower limit value of the inductor current ⎯ S200

FIG. 4A detect the output voltage in a switch circuit of a constant voltage output, and increase the upper limit value and the lower limit value of the inductor current when the output voltage is lower than the preset reference voltage, and decrease the upper limit value and the lower limit value of the inductor current when the output voltage is higher than the preset reference voltage; and detect the output current in a switch circuit of a constant current output, and increase the upper limit value and the lower limit value of the inductor current when the output current is lower than the preset reference current, and decrease the upper limit value and the lower limit value of the inductor current when the output current is higher than the preset reference current ⎯ S100 sample the inductor current in the circuit to obtain a sampling current, control a main switch transistor in the circuit to be switched off when the sampling current rises to the upper limit value of the inductor current, and control the main switch transistor to be switched on when the sampling current drops to the lower limit value of the inductor current ⎯ S200

FIG. 4B detect an output voltage or an output current in a circuit, and increase an upper limit value and a lower limit value of an inductor current when the output voltage is lower than a preset reference voltage or the output current is lower than a preset reference current; and decrease the upper limit value and the lower limit value of the inductor current when the output voltage is higher than the preset reference voltage or the output current is higher than the preset reference current — S100 sample the inductor current in the circuit to obtain a sampling current, control a main switch transistor in the circuit to be switched off when the sampling current rises to the upper limit value of the inductor current, and control the main switch transistor to be switched on when the sampling current drops to the lower limit value of the inductor current, and after sample the inductor current in the circuit to obtain a sampling current, determine whether the sampling current is smaller than zero, and if yes, switch off a synchronous rectifier in the circuit — S200

FIG. 5A detect the output voltage in a switch circuit of a constant voltage output, and increase the upper limit value and the lower limit value of the inductor current when the output voltage is lower than the preset reference voltage, and decrease the upper limit value and the lower limit value of the inductor current when the output voltage is higher than the preset reference voltage; and detect the output current in a switch circuit of a constant current output, and increase the upper limit value and the lower limit value of the inductor current when the output current is lower than the preset reference current, and decrease the upper limit value and the lower limit value of the inductor current when the output current is higher than the preset reference current — S100 sample the inductor current in the circuit to obtain a sampling current, control a main switch transistor in the circuit to be switched off when the sampling current rises to the upper limit value of the inductor current, and control the main switch transistor to be switched on when the sampling current drops to the lower limit value of the inductor current, and after sample the inductor current in the circuit to obtain a sampling current, determine whether the sampling current is smaller than zero, and if yes, switch off a synchronous rectifier in the circuit — S200

FIG. 5B acquire a sampling voltage of the output voltage in real time in a switch circuit of a constant voltage output, compare the sampling voltage with the preset reference voltage, obtain a compensation voltage according to a comparison result, convert the compensation voltage to obtain a command current and adjust the upper limit value and the lower limit value of the inductor current according to a preset compensation current value and the command current; and detect the output current in a switch circuit of a constant current output, increase the upper limit value and the lower limit value of the inductor current when the output current is lower than the preset reference current and decrease the upper limit value and the lower limit value of the inductor current when the output current is higher than the preset reference current ⟵ S100 sample the inductor current in the circuit to obtain a sampling current, control a main switch transistor in the circuit to be switched off when the sampling current rises to the upper limit value of the inductor current, and control the main switch transistor to be switched on when the sampling current drops to the lower limit value of the inductor current, and after sampling the inductor current in the circuit to obtain a sampling current, determining whether the sampling current is smaller than zero, and if yes, switching off a synchronous rectifier in the circuit ⟵ S200

FIG. 5C

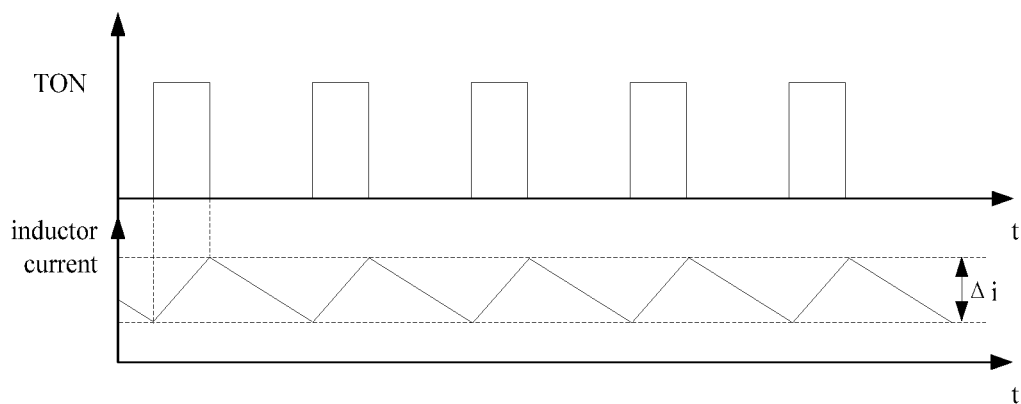

FIG. 6

CONTROL CIRCUIT AND CONTROL METHOD FOR SWITCH CIRCUIT AND SWITCHING-MODE POWER SUPPLY CIRCUIT

CROSS-REFERENCE TO RELATED APPLICATIONS

This Non-provisional application claims priority under 35 U.S.C. § 119(a) on Patent Application No(s). 201610780506.8 filed in People's Republic of China on Aug. 31, 2016, the entire contents of which are hereby incorporated by reference.

BACKGROUND OF THE INVENTION

Field of the Invention

The present invention relates to the field of electronic circuit technologies, and more particularly, to a control circuit and a control method for a switch circuit and a switching-mode power supply circuit.

Description of the Related Art

An existing switch circuit controls an output voltage by controlling switch-on or switch-off of a switch transistor. A common switch circuit includes a BUCK (step-down) circuit (as shown in FIG. 1A) and a BOOST (step-up) circuit (as shown in FIG. 1B). In a fixed frequency control mode, a control circuit is driven to generate a clock signal with a fixed frequency, and a main MOS is switched on at a rising edge of the clock signal; and the main MOS is switched off when the turn-on time of the main MOS reaches certain time or an inductor current reaches a certain value. When the rising edge of the next clock signal appears, the main MOS is switched on once again and may repeat in this way. Waveforms of the clock signal and a turn-on signal TON of the main MOS are as shown in FIG. 2. This control mode may achieve a fixed frequency. However, the circuit is slow in transient response. When a jump occurs in an output load, the output voltage may exhibit overshoot and drop for a long time.

Taking a load jump in the BUCK circuit for example, the description is made as below: the BUCK circuit as shown in FIG. 1A includes a main switch transistor M00, a second switch transistor D00, a capacitor C00, a capacitor C01, an inductor L00, and a load. The first switch transistor M00 is an MOS transistor, and the second switch transistor D00 is a freewheeling diode. The $V_{in}$ is an input voltage of the BUCK circuit, and the $V_{out}$ is an output voltage of the BUCK circuit. The main switch transistor M00 is controlled by a driving control circuit. When a load current jumps from a small value to a large value, the output voltage $V_{out}$ decreases, and FB, as a division voltage of the output voltage, also decreases. Therefore, an output voltage VC (compensation voltage) of an operational amplifier rises. After the voltage VC rises, the turn-on time of the main switch transistor M00 may increase. However, the main switch transistor M00 may not be switched on until the rising edge of the clock signal appears, while, at this moment, the output voltage has dropped to a lower value due to the increase of the load current, and there is limitation on the maximum turn-on time of the main switch transistor M00 (the maximum turn-on time is shorter than a clock cycle due to the presence of the clock signal). Therefore, not only current overshoot may occur in the inductor current, but also the output voltage may drop largely. Furthermore, the overshoot may be easily generated in the process of voltage recovery, and the circuit is relatively slow in transient response. The change relationship among the load current, the clock signal, the turn-on signal TON of the main switch transistor M00, the inductor current, the feedback voltage FB, and the compensation voltage VC is as shown in FIG. 3A. On the contrary, when the load current jumps from a large value to a small value, the output voltage Vow rises, and FB, as the division voltage of the output voltage, also rises. Therefore, the output voltage VC of the operational amplifier decreases. After the voltage VC decreases, the turn-on time of the main switch transistor M00 may be reduced. Since the main switch transistor M00 is switched on at the rising edge of the clock signal and has the minimum turn-on time, the output voltage may rise during the minimum turn-on time. Therefore, the overshoot of the output voltage is relatively large, and the circuit is relatively slow in transient response. The change relationship among the load current, the clock signal, the turn-on signal TON of the main switch transistor M00, the inductor current, the feedback voltage FB, and the compensation voltage VC is as shown in FIG. 3B.

As can be seen, an existing switch circuit is slow in transient response in the process of achieving the fixed frequency control of the clock signal, and when a jump occurs in the output load, the output voltage may exhibit overshoot and drop for a long time.

BRIEF SUMMARY OF THE INVENTION

To overcome the technical problem that a conventional switch circuit is slow in transient response in the process of achieving a fixed frequency control of a clock signal and the output voltage may exhibit overshoot and drop for a long time when a jump occurs in an output load, the present invention provides a control method and a control circuit for a switch circuit and a switching-mode power supply circuit.

A control method for the switch circuit provided by the present invention includes following steps: detecting an output voltage or an output current in a circuit, and increasing an upper limit value and a lower limit value of an inductor current when the output voltage is lower than a preset reference voltage or the output current is lower than a preset reference current; and decreasing the upper limit value and the lower limit value of the inductor current when the output voltage is higher than the preset reference voltage or the output current is higher than the preset reference current; and sampling the inductor current in the circuit to obtain a sampling current, and controlling a main switch transistor in the circuit to be switched off when the sampling current rises to the upper limit value of the inductor current; and controlling the main switch transistor to be switched on when the sampling current drops to the lower limit value of the inductor current.

As an implementable mode, detecting the output voltage or the output current in the circuit, and increasing the upper limit value and the lower limit value of the inductor current when the output voltage is lower than the preset reference voltage or the output current is lower than the preset reference current; and decreasing the upper limit value and the lower limit value of the inductor current when the output voltage is higher than the preset reference voltage or the output current is higher than the preset reference current may include following steps:

detecting the output voltage in a switch circuit of a constant voltage output, and increasing the upper limit value and the lower limit value of the inductor current when the output voltage may be lower than the preset reference voltage; and decreasing the upper limit value and the lower limit value of the inductor current when the output voltage may be higher than the preset reference voltage; and detecting the output current in a switch circuit of a constant current output, and increasing the upper limit value and the lower limit value of the inductor current when the output current may be lower than the preset reference current; and decreasing the upper limit value and the lower limit value of the inductor current when the output current may be higher than the preset reference current.

As an implementable mode, detecting the output voltage in the switch circuit of the constant voltage output, and increasing the upper limit value and the lower limit value of the inductor current when the output voltage is lower than the preset reference voltage, or decreasing the upper limit value and the lower limit value of the inductor current when the output voltage is higher than the preset reference voltage may include following steps:

acquiring a sampling voltage of the output voltage in real time;

comparing the sampling voltage with the preset reference voltage, and obtaining a compensation voltage according to a comparison result;

converting the compensation voltage to obtain a command current; and adjusting the upper limit value and the lower limit value of the inductor current according to a preset compensation current value and the command current.

As an implementable mode, the control method for the switch circuit provided by the present invention may further include following steps:

after sampling the inductor current in the circuit to obtain a sampling current, determining whether the sampling current is smaller than zero, and if yes, switching off a synchronous rectifier in the circuit.

Based on the same inventive concept, the present invention further provides a control circuit for a switch circuit, and the control circuit includes a command current acquiring circuit, an adjuster, an inductor current control circuit, and a drive circuit; wherein the command current acquiring circuit is configured to detect an output voltage or an output current in a circuit, convert the output voltage or the output current into a command current, and output the command current to the adjuster;

the adjuster is configured to adjust an upper limit value and a lower limit value of an inductor current according to the command current and a preset compensation current value; and the inductor current control circuit is connected with the adjuster, the drive circuit, and a sampling terminal of the inductor current in the circuit; the inductor current control circuit is configured to sample the inductor current in the circuit to obtain a sampling current, generate a switching signal according to the sampling current and the upper limit value and the lower limit value of the inductor current, and control a main switch transistor in the circuit by the drive circuit, the main switch transistor is controlled to be switched off when the sampling current rises to the upper limit value of the inductor current, and the main switch transistor is controlled to be switched on when the sampling current drops to the lower limit value of the inductor current.

As an implementable mode, the command current acquiring circuit may include a load voltage sampling unit, a voltage comparing unit, and a voltage-to-current converting unit;

the load voltage sampling unit may be connected with the voltage comparing unit and the voltage-to-current converting unit in sequence; and the load voltage sampling unit may be configured to sample a voltage between two ends of a load in the circuit to obtain a sampling voltage, and output the sampling voltage to the voltage comparing unit; and the voltage comparing unit may be configured to compare the sampling voltage with a preset reference voltage, output a voltage signal obtained by comparison to the voltage-to-current converting unit for conversion to obtain a command current, and output the command current to the adjuster.

As an implementable mode, the load voltage sampling unit may be a resistance dividing sampling circuit.

As an implementable mode, the voltage comparing unit may be an operational amplifier; and a positive-going input terminal of the operational amplifier may be connected with a preset reference voltage, a negative-going input terminal of the operational amplifier may be connected with an output terminal of the load voltage sampling unit, and an output terminal of the operational amplifier may be connected with an input terminal of the voltage-to-current converting unit.

As an implementable mode, the adjuster may be an adder or a subtracter; and a first input terminal of the adder or the subtracter may be connected with an output terminal of the voltage-to-current converting unit, a second input terminal of the adder or the subtracter may be connected with a preset compensation current value, and an output terminal of the adder or the subtracter may be connected with the inductor current control circuit.

As an implementable mode, when the adjuster is the adder, the command current may be the lower limit value of the inductor current; and when the adjuster is the subtracter, the command current may be the upper limit value of the inductor current.

As an implementable mode, the inductor current control circuit may include a zero-crossing comparison circuit; and the zero-crossing comparison circuit may be configured to determine whether the sampling current is smaller than zero, and output a control signal to switch off a synchronous rectifier in the circuit when the sampling current is determined to be smaller than zero.

Based on the same inventive concept, the present invention further provides a switching-mode power supply circuit, which includes an inductor, a main switch transistor, and the control circuit for the switch circuit according to any one of the above.

Compared with the prior art, beneficial effects of the present invention are as below.

The present invention provides a control method and a control circuit for a switch circuit. Detect the output voltage or the output current in the circuit, and increase the upper limit value and the lower limit value of the inductor current when the output voltage is lower than the preset reference voltage or the output current is lower than the preset reference current; decrease the upper limit value and the lower limit value of the inductor current when the output voltage is higher than the preset reference voltage or the output current is higher than the preset reference current; and sample the inductor current in the circuit to obtain the sampling current, control the main switch transistor in the circuit to be switched off when the sampling current rises to the upper limit value of the inductor current, and control the main switch transistor to be switched on when the sampling current drops to the lower limit value of the inductor current. The switching-mode power supply circuit provided by the present invention includes the inductor, the main switch transistor, and the control circuit for the switch circuit.

Using the control method and control circuit for the switch circuit and the switching-mode power supply circuit including the control circuit provided by the present invention, when the output voltage or the output current jumps from a small value to a large value, the inductor current can reach the lower limit value of the inductor current earlier than in a steady state, so that the turn-off time of the main switch transistor can become shorter and the turn-on time can become longer. Furthermore, there is no limitation on the maximum turn-on time in this control method, so that the inductor current can be increased more rapidly. Therefore, when the load current is increased, the inductor current is fast in response without overshoot, the output voltage drops little, there is no overshoot in the process of voltage recovery, and the circuit is fast in transient response. On the contrary, when the output voltage or the output current jumps from a large value to a small value, the inductor current cannot reach the lower limit value of the inductor current, so that the main switch transistor may be switched off all the time until the inductor current reaches the lower limit value of the inductor current. Further, there is no limitation on the minimum turn-on time in this control method, so that there is no limitation on the turn-off time of the main switch transistor, and the inductor current can be decreased more rapidly. Therefore, when the load current is decreased, the inductor current is fast in response without overshoot, the overshoot of the output voltage is little, and the circuit is fast in transient response.

BRIEF DESCRIPTION OF THE DRAWINGS

FIG. 4A is a schematic flow chart of a control method for a switch circuit according to an embodiment of the present invention;

FIG. 4B is a schematic flow chart of a control method for a switch circuit according to another embodiment of the present invention;

FIG. 5A is a schematic flow chart of a control method for a switch circuit including a synchronous rectifier instead of a freewheeling diode according to an embodiment of the present invention;

FIG. 5B is a schematic flow chart of a control method for a switch circuit including a synchronous rectifier instead of a freewheeling diode according to another embodiment of the present invention;

FIG. 5C is a schematic flow chart of a control method for a switch circuit including a synchronous rectifier instead of a freewheeling diode according to still another embodiment of the present invention;

FIG. 6 is a schematic diagram of a change relationship between an inductor current and a turn-on signal TON of a main switch transistor in the control method for the switch circuit as shown in FIGS. 4A-4B or FIGS. 5A-5C;

DETAILED DESCRIPTION OF THE INVENTION

Figure 1A:
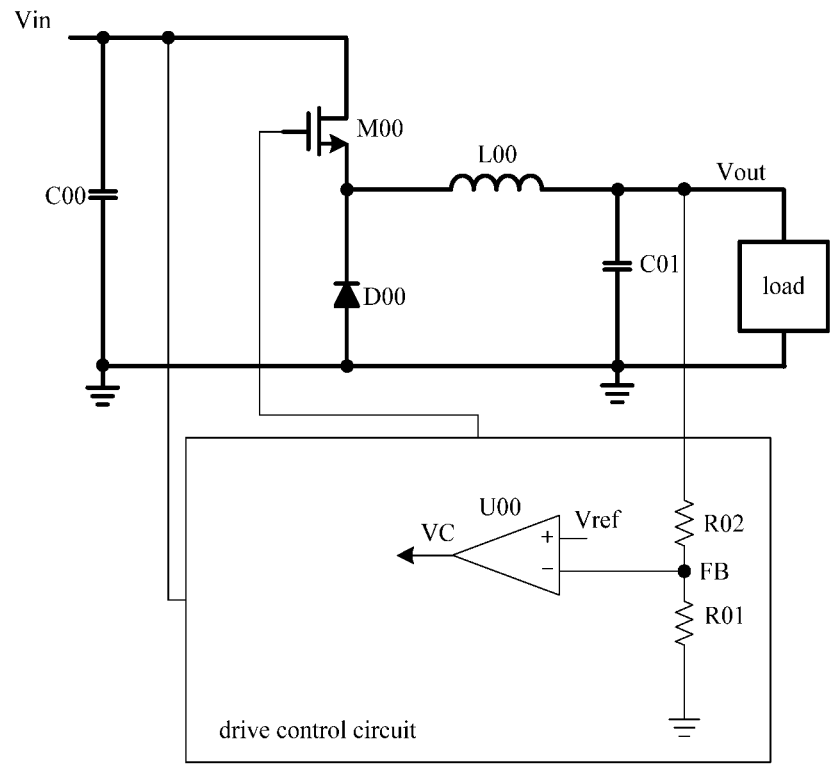
FIG. 1A is a schematic structural diagram of a BUCK (step-down) circuit in the prior art.
Figure 1B:
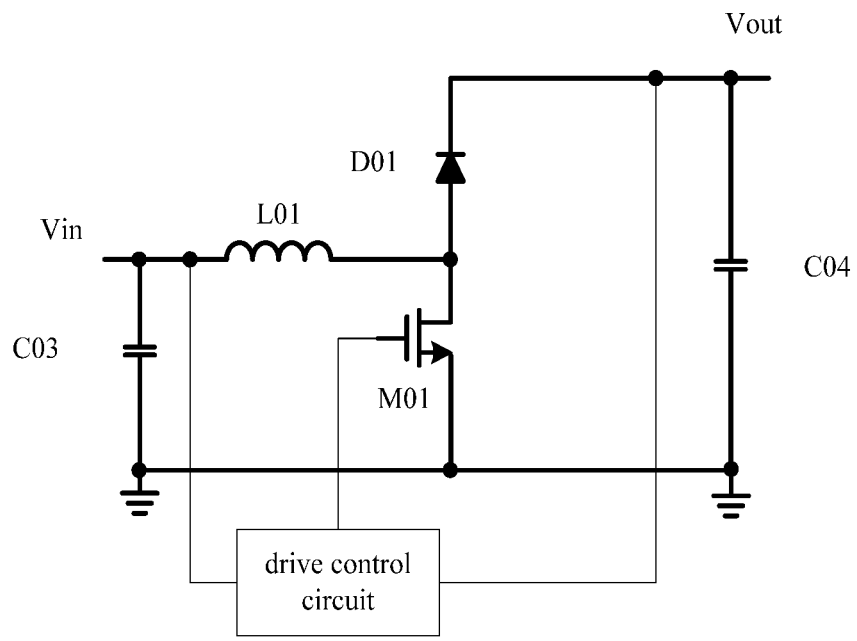
FIG. 1B is a schematic structural diagram of a BOOST (step-up) circuit in the prior art.
Figure 2:
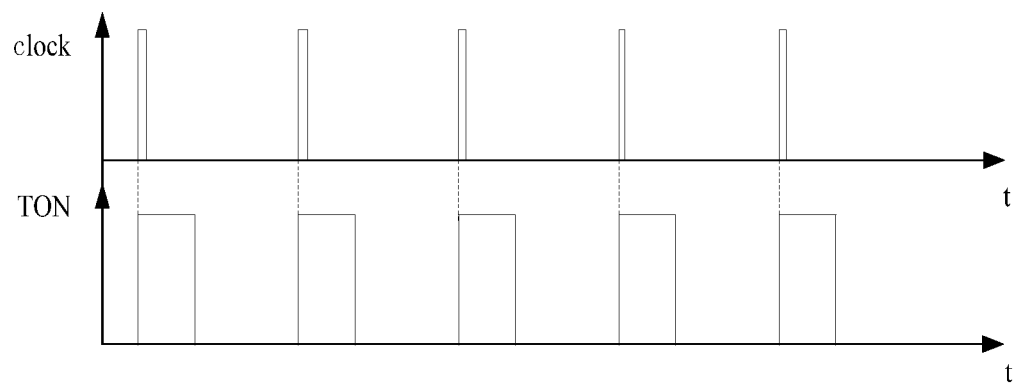
FIG. 2 is a schematic diagram of waveforms of a clock signal of an existing switch circuit in a fixed frequency mode and a turn-on signal TON of a main switch transistor in the prior art.
Figure 3A:
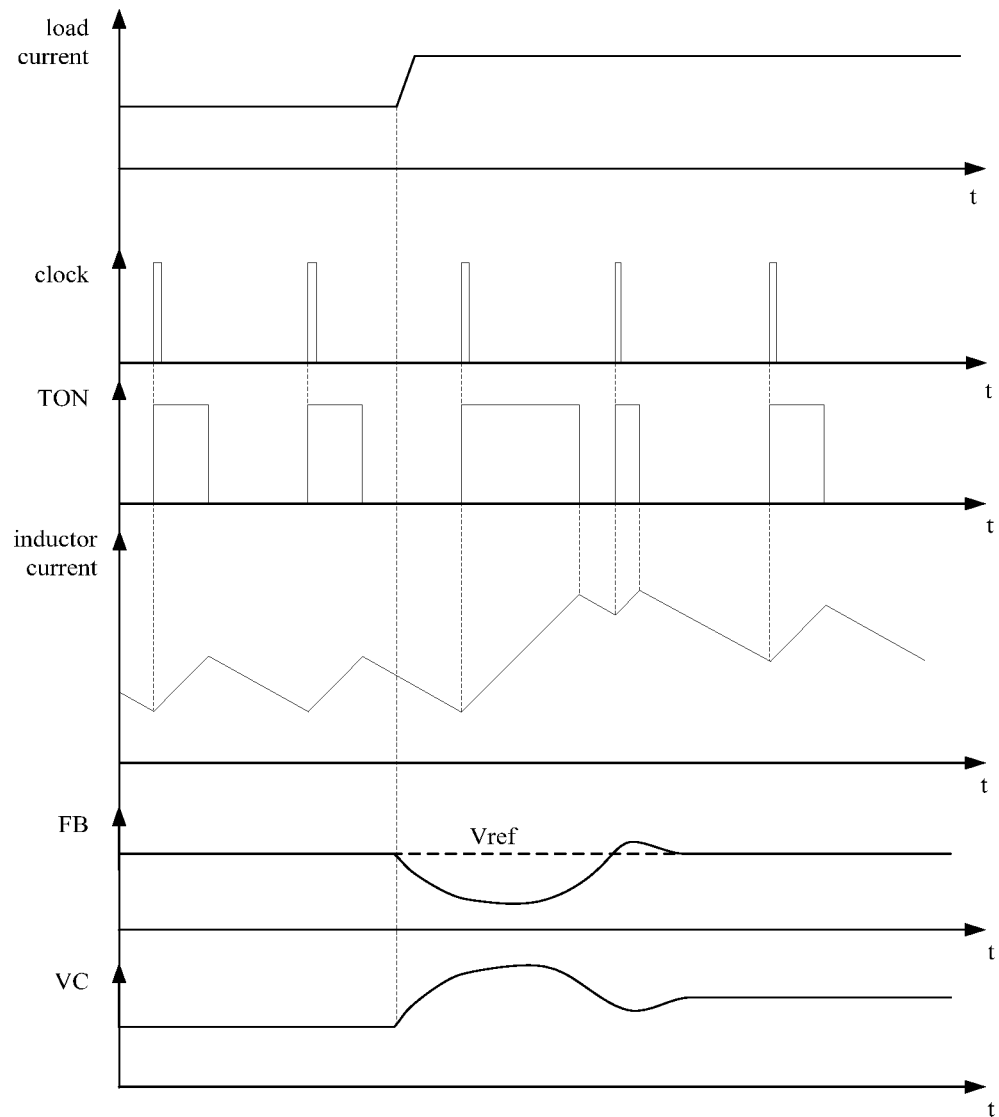
FIG. 3A is a schematic diagram of a change relationship among a load current, the clock signal, the turn-on signal TON of the main switch transistor, an inductor current, a feedback voltage FB, and a compensation voltage VC when the load current in the existing switch circuit jumps from a small value to a large value in the prior art.
Figure 3B:
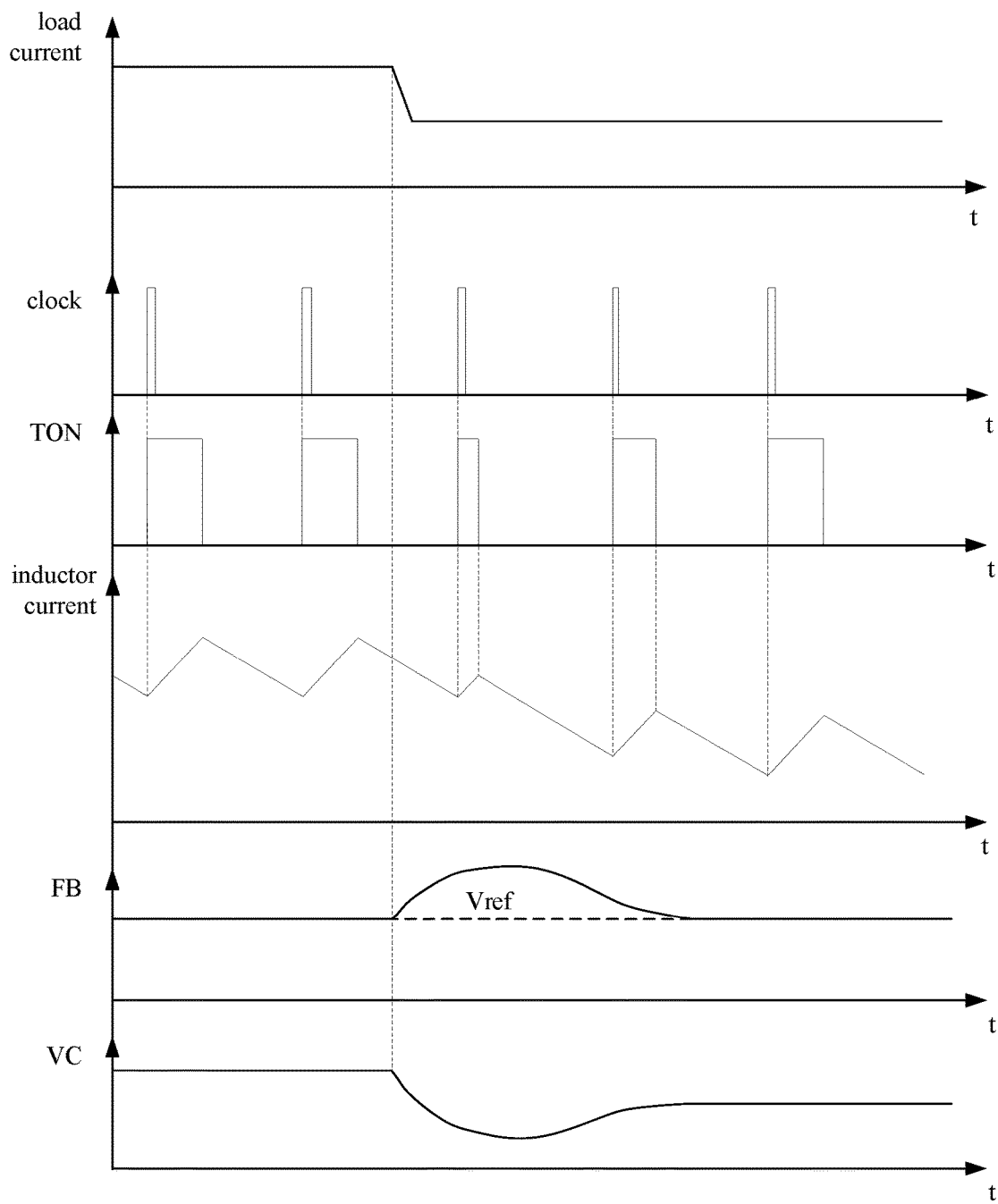
FIG. 3B is a schematic diagram of a change relationship among the load current, the clock signal, the turn-on signal TON of the main switch transistor, the inductor current, the feedback voltage FB, and the compensation voltage VC when the load current in the existing switch circuit jumps from a large value to a small value in the prior art.

With reference to the accompanying drawings, the foregoing and additional technical features and advantages of the present invention are described clearly and completely below. Obviously, the described embodiments are only a part of the embodiments of the present invention and not all embodiments.

An embodiment of the present invention provides a control method for a switch circuit, as shown in FIG. 4A, and the method includes following steps:

S100: detecting an output voltage or an output current in a circuit, and increasing an upper limit value and a lower limit value of an inductor current when the output voltage is lower than a preset reference voltage or the output current is lower than a preset reference current; and decreasing the upper limit value and the lower limit value of the inductor current when the output voltage is higher than the preset reference voltage or the output current is higher than the preset reference current; and S200: sampling the inductor current in the circuit to obtain a sampling current, and controlling a main switch transistor in the circuit to be switched off when the sampling current rises to the upper limit value of the inductor current; and controlling the main switch transistor to be switched on when the sampling current drops to the lower limit value of the inductor current.

As shown in FIG. 6, in the switch circuit, the inductor current has an upper limit and a lower limit. When the inductor current rises to the upper limit of the current, the main switch transistor is switched off; when the inductor current is equal to (equivalent to reaching) the lower limit of the current, the main switch transistor is switched on. Based on the above control principle, the present invention controls the output current by regulating the upper limit and the lower limit of the inductor current, thereby controlling the output voltage. This control mode is fast in transient response, and overshoot and drop of the output voltage recover relatively fast when a jump occurs in an output load.

Specifically, using the control method for the switch circuit provided by the present invention, when the output voltage or the output current jumps from small to large, the inductor current can reach the lower limit value of the inductor current earlier than in a steady state, so that the turn-off time of the main switch transistor can become shorter and the turn-on time can become longer. Furthermore, there is no limitation on the maximum turn-on time in this control method, so that the inductor current can be increased more rapidly. Therefore, when the load current is increased, the inductor current is fast in response without overshoot, the output voltage drops little, there is no overshoot in the process of voltage recovery, and the circuit is fast in transient response. On the contrary, when the output voltage or the output current jumps from large to small, the inductor current cannot reach the lower limit value of the inductor current, so that the main switch transistor can be switched off all the time until the inductor current reaches the lower limit value of the inductor current. Further, there is no limitation on the minimum turn-on time in this control method, so that there is no limitation on the turn-off time of the main switch transistor, and the inductor current can decrease more rapidly. Therefore, when the load current decreases, the inductor current is fast in response without overshoot, overshoot of the output voltage is little, and the circuit is fast in transient response.

Further, another embodiment of the present invention provides a control method for a switch circuit, as shown in FIG. 4B, and the method includes following steps:

S100: by detecting the output voltage in the switch circuit of a constant voltage output, the upper limit value and the lower limit value of the inductor current are increased when the output voltage is lower than the preset reference voltage. The upper limit value and the lower limit value of the inductor current are decreased when the output voltage is higher than the preset reference voltage, and by detecting the output current in the switch circuit of a constant current output, the upper limit value and the lower limit value of the inductor current are increased when the output current is lower than the preset reference current. The upper limit value and the lower limit value of the inductor current are decreased when the output current is higher than the preset reference current.

Further, S200 in FIG. 4B is same as S200 in FIG. 4A and thus is not described here again.

In the switch circuit of the constant voltage output, Step S100 of FIG. 4B may be implemented through the following specific steps:

S110: acquiring a sampling voltage of the output voltage in real time;

S120: comparing the sampling voltage with the preset reference voltage, and obtaining a compensation voltage according to a comparison result;

S130: converting the compensation voltage to obtain a command current; and

S140: adjusting the upper limit value and the lower limit value of the inductor current according to a preset compensation current value and the command current.

The above command current is generally a voltage signal, which is obtained by the compensation voltage multiplied by a certain proportion and then added or subtracted a certain value. Acquiring the command current may be achieved by connecting a proportional circuit to a circuit such as an adder or a subtracter.

Furthermore, refer to FIG. 5A-FIG. 5C, wherein S100 of FIG. 5A is same as S100 of FIG. 4A and thus is not described here again; S100 of FIG. 5B is same as S100 of FIG. 4B and thus is not described here again; S100 of FIG. 5C comprise S100 of FIG. 4B and S110-S140 mentioned above and thus is not described here again. For such a case where an auxiliary switch transistor in the switch circuit is a synchronous rectifier instead of a freewheeling diode, S200 of FIG. 5A-FIG. 5C provided by the present invention comprises S200 of FIG. 4A or FIG. 4B and further includes following steps: after sampling the inductor current in the circuit to obtain the sampling current, determining whether the sampling current is smaller than zero, and if yes, switching off the synchronous rectifier in the circuit.

When the switch circuit is in the discontinuous conduction mode (DCM) and the lower limit value of the inductor current is smaller than zero, if the auxiliary switch transistor is a freewheeling diode, the inductor current is reduced to zero, and no negative current may occur. The inductor current remains at zero all the time, the compensation voltage rises, and both the upper limit and the lower limit of the inductor current increase. When the lower limit of the inductor current increases more than zero, namely, when the sampling current is equal to the lower limit value of the inductor current, the main switch transistor is switched on; and if the auxiliary switch transistor is a synchronous rectifier, the inductor current is reduced to zero, and the synchronous rectifier is switched off (negative current may occur if the synchronous rectifier is not switched off). The inductor current remains at zero all the time, the compensation voltage rises, and both the upper limit value and the lower limit value of the inductor current increase. When the lower limit of the inductor current increases more than zero, namely, when the sampling current is equal to the lower limit value of the inductor current, the main switch transistor is switched on.

Based on the same inventive concept, the present invention further provides a control circuit for a switch circuit, which includes a command current acquiring circuit, an adjuster, an inductor current control circuit and a drive circuit.

The command current acquiring circuit is configured to detect an output voltage or an output current in the circuit, convert the output voltage or the output current into a command current, and output the command current to the adjuster. The adjuster is configured to adjust an upper limit value and a lower limit value of an inductor current according to the command current and a preset compensation current value. The inductor current control circuit is connected with the adjuster, the drive circuit, and a sampling terminal of the inductor current in the circuit. The inductor current control circuit is configured to sample the inductor current in the circuit to obtain a sampling current, generate a switching signal according to the sampling current and the upper limit value and the lower limit value of the inductor current, and control a main switch transistor in the circuit by the drive circuit. When the sampling current rises to the upper limit value of the inductor current, the main switch transistor is controlled to be switched off, and when the sampling current drops to the lower limit value of the inductor current, the main switch transistor is controlled to be switched on.

The above adjuster may be an adder or a subtracter. When the adjuster is the adder, the command current is the lower limit value of the inductor current; and when the adjuster is the subtracter, the command current is the upper limit value of the inductor current. A specific implementation is as below.

Figure 7:
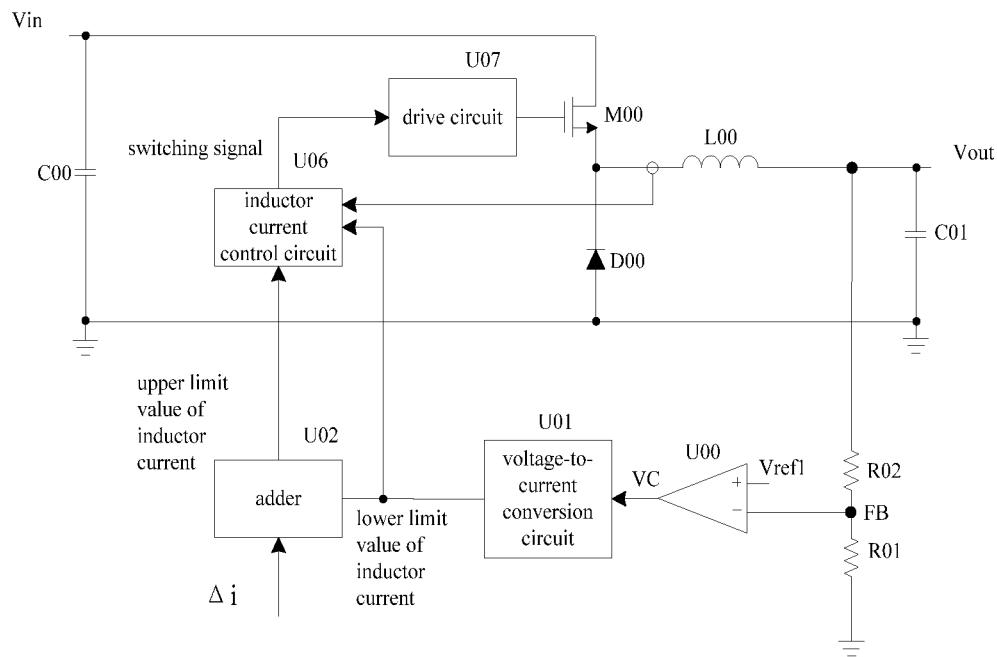
FIG. 7 is a schematic structural diagram of a control circuit for a switch circuit according to one embodiment of the present invention.

Referring to FIG. 7, a control circuit for a switch circuit provided by an embodiment of the present invention includes a command current acquiring circuit, an adder U02, an inductor current control circuit U06, and a drive circuit U07.

The command current acquiring circuit is configured to detect an output voltage or an output current in the circuit, convert the output voltage or output current into a command current, and output the command current to the adder U02. The command current acquiring circuit includes a load voltage sampling unit (including resistors R02 and R01 in the figure), an operational amplifier U00, and a voltage-to-current conversion circuit U01.

The adder U02 is configured to increase the upper limit value and the lower limit value of the inductor current when the output current (namely, the load current) jumps from small to large, and reduce the upper limit value and the lower limit value of the inductor current when the output current jumps from large to small. The inductor current control circuit U06 is connected with the adder U02, the drive circuit U07, and a sampling terminal of the inductor current in the circuit.

As shown in FIG. 7, the inductor current control circuit U06 samples the current of the inductor L00. Therefore, the sampling terminal of the inductor current in the circuit may be arranged at the input terminal of the inductor L00, or may be arranged at a terminal of the main switch transistor M00 or a terminal of the diode D00.

After voltage division by the voltage dividing resistors R01 and R02, the output voltage $V_{out}$ of the switch circuit obtains a voltage FB and inputs the voltage FB to a negative input terminal of the operational amplifier U00, and a positive input terminal of the operational amplifier U00 is connected with a preset reference voltage Vref1. A command current is obtained at the output terminal VC of the operational amplifier U00 through the voltage-to-current conversion circuit U01. The command current controls the lower limit of the inductor current. Generally, in a drive control circuit, the inductor current obtained by sampling is a voltage signal. Therefore, the output (namely, the command current) of the voltage-to-current conversion circuit U01 is also a voltage signal. The lower limit value of the inductor current may be a value smaller than zero. The command current controlling the lower limit of the inductor current is inputted to an input terminal of the adder U02, and a preset compensation current Δi is connected to another input terminal of the adder U02. The preset compensation current Δi may be a fixed value or may be a variable value. The adder U02 adds the lower limit value of the inductor current and the preset compensation current Δi to obtain the upper limit value of the inductor current. Both the upper limit and the lower limit of the inductor current are connected to the input of the inductor current control circuit U06, the inductor current control circuit U06 outputs a switching signal, and the switching signal drives the main switch transistor M00 through the drive circuit U07.

It should be supplementarily explained that when the freewheeling diode D00 in the switch circuit is a synchronous rectification MOS transistor, the control signal of the synchronous rectification MOS transistor is also driven by the drive circuit U07. The operational amplifier U00 regulates the output voltage by regulating a value of the output terminal VC thereof, so that the voltage FB is equal to the preset reference voltage Vref1, thereby controlling the output voltage.

Specifically, when the output voltage is low, the voltage FB is smaller than the preset reference voltage Vref1, the VC becomes larger, and the lower limit of the inductor current becomes larger. The upper limit value of the inductor current is obtained by adding the lower limit value of the inductor current and the preset compensation current Δi together. The inductor current control circuit U06 obtains the switching signal according to control values of the upper limit and the lower limit of the inductor current. By driving the switch of the main switch transistor M00 by the drive circuit U07, the inductor current is increased, and the output voltage is increased. On the contrary, when the output voltage is high, the voltage FB is larger than the preset reference voltage Vref1, the VC becomes smaller, and the lower limit value of the inductor current becomes smaller. The upper limit value of the inductor current is obtained by adding the lower limit value of the inductor current and the preset compensation current Δi together. The inductor current control circuit U06 obtains the switching signal according to the control values of the upper limit and the lower limit of the inductor current. By driving the switch of the main switch transistor M00 by means of the drive circuit U07, the inductor current is decreased, and the output voltage is decreased.

When the preset compensation current Δi is a fixed value, the switching frequency is not a fixed frequency; and if a fixed frequency is needed, the switching frequency can be controlled by controlling the preset compensation current Δi.

Figure 8:
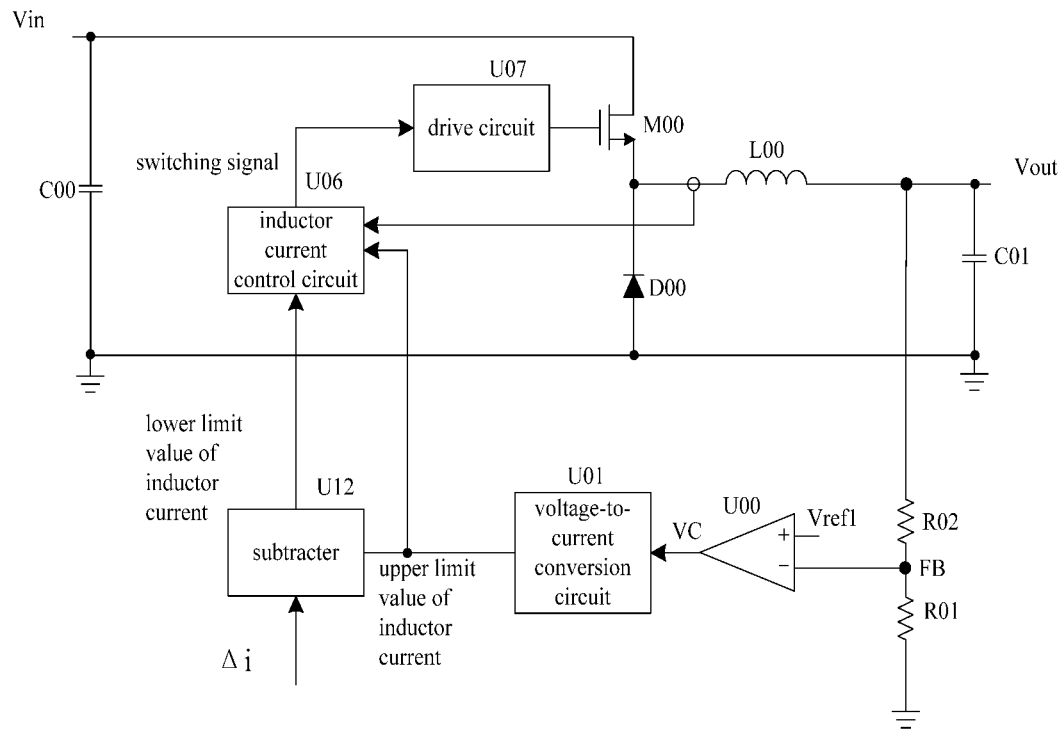
FIG. 8 is a schematic structural diagram of a control circuit for a switch circuit according to another embodiment of the present invention.

Another implementation manner by means of the subtracter is as shown in FIG. 8. The voltage-to-current conversion circuit U01 generates the upper limit value of the inductor current, and inputs the upper limit value to an input terminal of the subtracter U12. The preset compensation current Δi is also inputted to another input terminal of the subtracter U12. The lower limit value of the inductor current is obtained by subtracting the preset compensation current Δi from the upper limit value of the inductor current. Both the upper limit value and the lower limit value of the inductor current are inputted to the inductor current control circuit U06.

A load jump in the BUCK circuit is taken as an example for description in the following.

Figure 9:
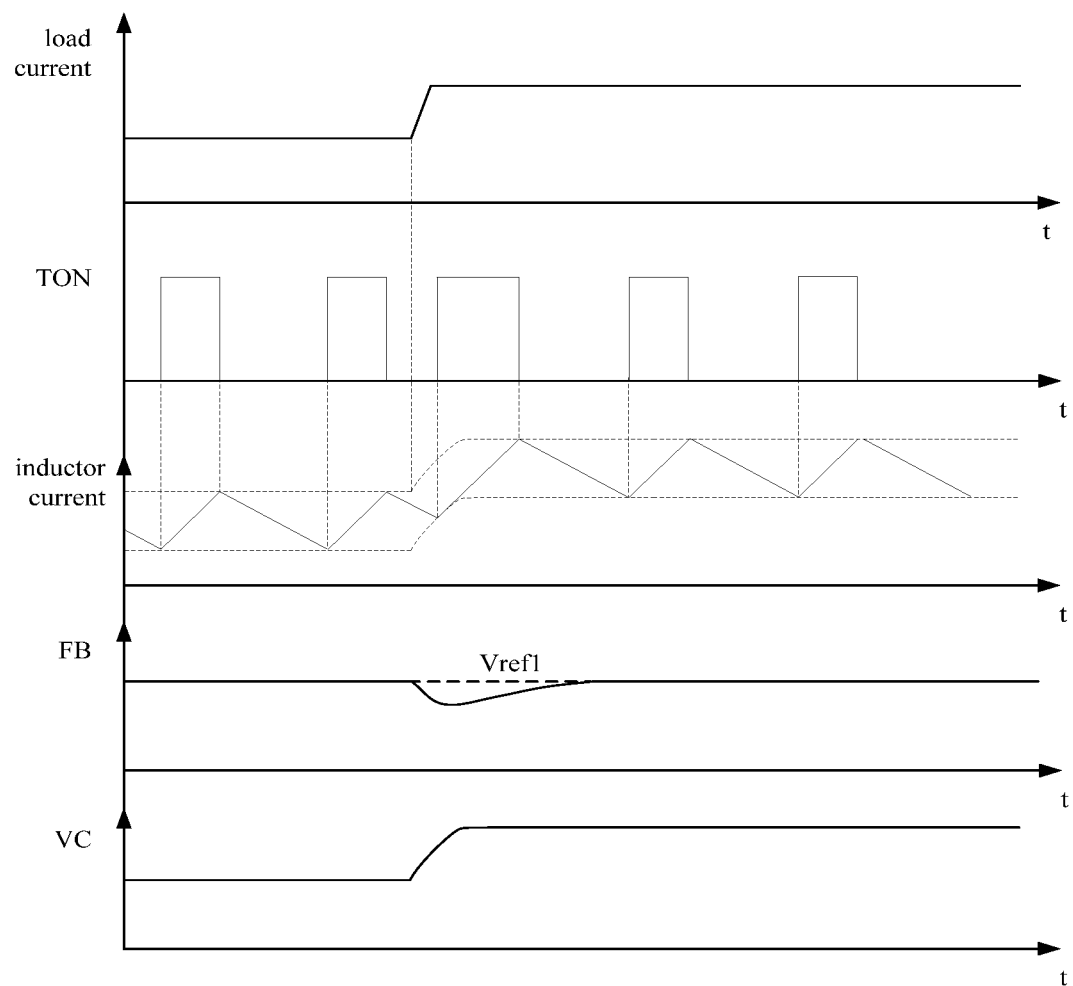
FIG. 9 is a schematic diagram of waveforms of a load current, a turn-on signal TON of a main MOS, an inductor current, a feedback voltage FB, and a compensation voltage VC in the control circuit for the switch circuit as shown in FIG. 6.

When a load current jumps from small to large, the output voltage $V_{out}$ is reduced, and FB, as a division voltage of the output voltage, is also reduced. Therefore, the output voltage VC of the operational amplifier rises. After the voltage VC rises, both the upper limit value and the lower limit value of the inductor current become larger simultaneously, the inductor current reaches the lower limit value of the inductor current earlier than in a steady state, so that the turn-off time of the main switch transistor M00 becomes shorter immediately and the turn-on time becomes longer immediately. Furthermore, there is no limitation on the maximum turn-on time in this control method, so that the inductor current can be increased more rapidly. Therefore, when the load current is increased, the inductor current is fast in response without overshoot, the output voltage drops little, there is no overshoot in the process of voltage recovery, and the circuit is fast in transient response. The load current, the turn-on signal TON of the main switch transistor, the inductor current, the feedback voltage FB, and the compensation voltage VC are as shown in FIG. 9.

Figure 10:
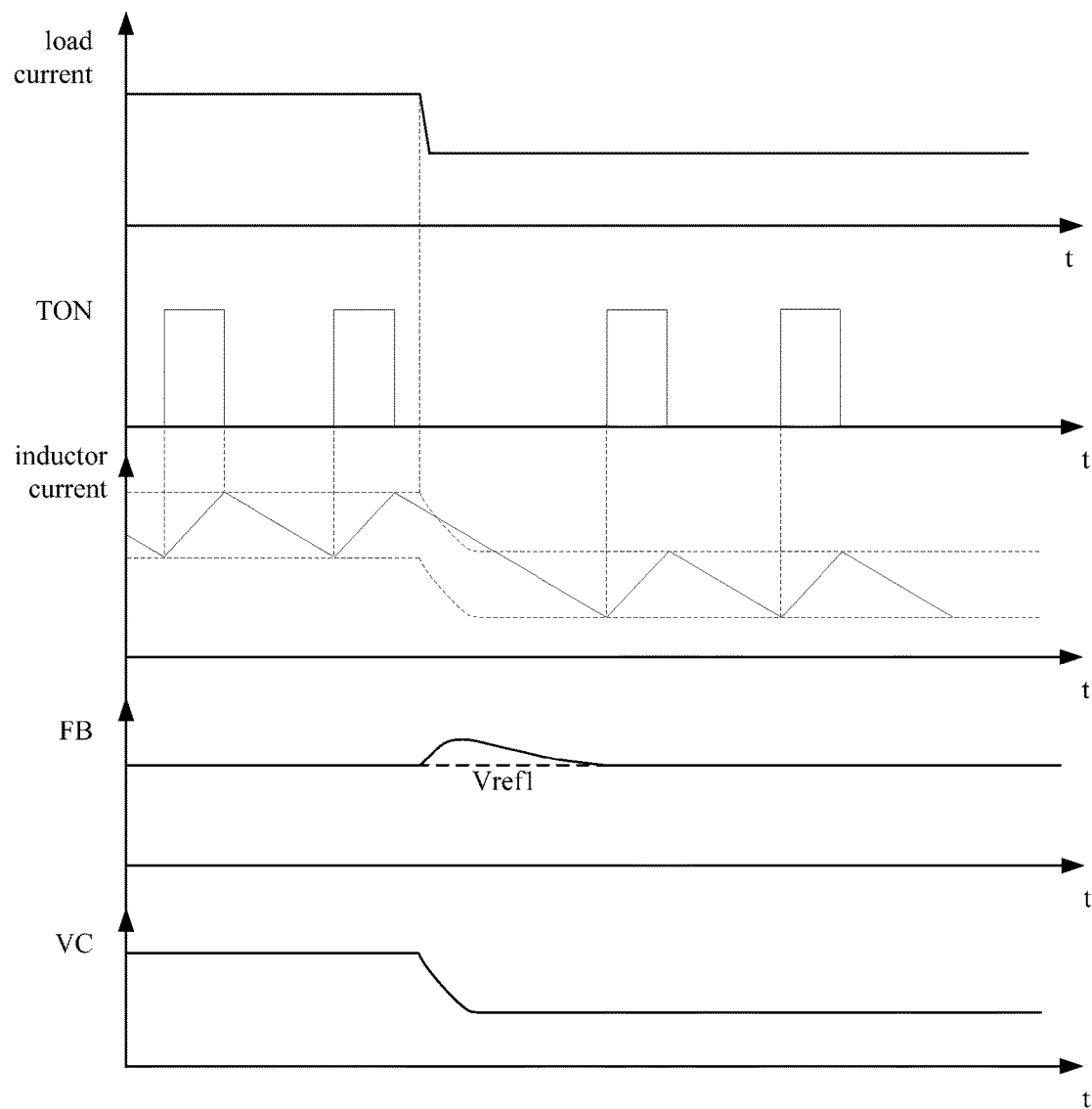
FIG. 10 is a schematic diagram of waveforms of a load current, a turn-on signal TON of a main MOS, an inductor current, a feedback voltage FB, and a compensation voltage VC in the control circuit for the switch circuit as shown in FIG. 7.

When the load current jumps from large to small, the output voltage $V_{out}$ rises, and FB, as the division voltage of the output voltage, also rises. Therefore, the voltage VC of the operational amplifier is reduced. After the voltage VC is reduced, both the upper limit value and the lower limit value of the inductor current become smaller simultaneously, and the inductor current cannot reach the lower limit value of the inductor current, so that the main switch transistor M00 is switched off all the time until the inductor current reaches the lower limit value of the inductor current. Further, there is no limitation on the minimum turn-on time in this control method, so that there is no limitation on the turn-off time of the main switch transistor, and the inductor current can be decreased more rapidly. Therefore, when the load current is decreased, the inductor current is fast in response without overshoot, the overshoot of the output voltage is little, and the circuit is fast in transient response. The load current, the turn-on signal TON of the main MOS, the inductor current, the feedback voltage FB, and the compensation voltage VC are as shown in FIG. 10.

Furthermore, for such a case where an auxiliary switch (the freewheeling diode D00) in the switch circuit is a synchronous rectifier, in the control circuit for the switch circuit provided by the present invention, the inductor current control circuit U06 includes a zero-crossing comparison circuit. The zero-crossing comparison circuit is used for determining whether the sampling current is smaller than zero and outputting a control signal to switch off the synchronous rectifier in the switch circuit when the sampling current is smaller than zero.

Figure 11:
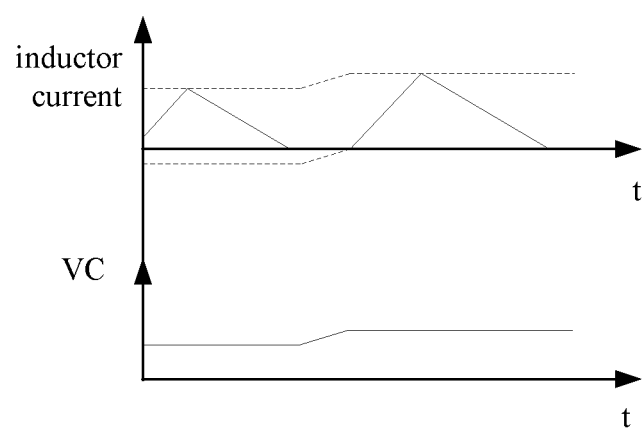
FIG. 11 is a schematic diagram of a change relationship between the inductor current and the compensation voltage VC in the circuit when the control circuit for the switch circuit as shown in FIG. 7 and FIG. 8 operates in a discontinuous conduction mode (DCM).

Referring to FIG. 11, when the switch circuit is in the discontinuous conduction mode (DCM) and the lower limit value of the inductor current is smaller than zero, if the auxiliary switch transistor is a freewheeling diode, the inductor current is reduced to zero, and no negative current may occur. The inductor current remains at zero all the time, the compensation voltage VC rises, and the lower limit of the inductor current increases. When the lower limit of the inductor current increases more than zero, namely, when the sampling current is equal to the lower limit value of the inductor current, the main switch transistor M00 is switched on; and if the auxiliary switch transistor is a synchronous rectifier, the inductor current is reduced to zero, and the synchronous rectifier is switched off (negative current may occur if the synchronous rectifier is not switched off). The inductor current always remains at zero, the compensation voltage VC rises, and the lower limit value of the inductor current increases. When the lower limit of the inductor current increases more than zero, namely, when the sampling current is equal to the lower limit value of the inductor current, the main switch transistor M00 is switched on.

Based on the same inventive concept, the present invention further provides a switching-mode power supply circuit, which includes an inductor, a main switch transistor, and the above control circuit for the switch circuit.

In the present invention, the output current is controlled by regulating the upper limit and the lower limit of the inductor current, thereby controlling the output voltage. This switching-mode power supply circuit of the present invention is fast in transient response, and when a jump occurs in the output load, overshoot and drop of the output voltage recover faster.

In the above specific embodiments, the objectives, the technical solutions and the beneficial effects of the present invention are further described in detail. However, it should be understood that the above embodiments are merely the specific embodiments of the present invention and are not intended to limit the scope of protection of the present invention. It is particularly pointed out that for those skilled in the art, all modifications, equivalent substitutions and improvements made within the spirit and principle of the present invention shall fall within the scope of protection of the present invention.

What is claimed is:

1. A control method for a switch circuit, comprising following steps:

detecting an output voltage or output current in a circuit, and increasing an upper limit value and a lower limit value of an inductor current when the output voltage is lower than a preset reference voltage or the output current is lower than a preset reference current; and decreasing the upper limit value and the lower limit value of the inductor current when the output voltage is higher than the preset reference voltage or the output current is higher than the preset reference current; and sampling the inductor current in the circuit to obtain a sampling current, and controlling a main switch transistor in the circuit to be switched off when the sampling current rises to the upper limit value of the inductor current; and controlling the main switch transistor to be switched on when the sampling current drops to the lower limit value of the inductor current;

wherein detecting the output voltage or the output current in the circuit, and increasing the upper limit value and the lower limit value of the inductor current when the output voltage is lower than the preset reference voltage or the output current is lower than the preset reference current, and decreasing the upper limit value and the lower limit value of the inductor current when the output voltage is higher than the preset reference voltage or the output current is higher than the preset reference current comprise the following steps:

detecting the output voltage in a switch circuit of a constant voltage output, and increasing the upper limit value and the lower limit value of the inductor current when the output voltage is lower than the preset reference voltage; and decreasing the upper limit value and the lower limit value of the inductor current when the output voltage is higher than the preset reference voltage; and detecting the output current in a switch circuit of a constant current output, and increasing the upper limit value and the lower limit value of the inductor current when the output current is lower than the preset reference current; and decreasing the upper limit value and the lower limit value of the inductor current when the output current is higher than the preset reference current;

wherein detecting the output voltage in the switch circuit of the constant voltage output, and increasing the upper limit value and the lower limit value of the inductor current when the output voltage is lower than the preset reference voltage, and decreasing the upper limit value and the lower limit value of the inductor current when the output voltage is higher than the preset reference voltage comprise the following steps:

acquiring a sampling voltage of the output voltage in real time;

comparing the sampling voltage with the preset reference voltage, and obtaining a compensation voltage according to a comparison result;

converting the compensation voltage to obtain a command current; and adjusting the upper limit value and the lower limit value of the inductor current according to a preset compensation current value and the command current;

wherein converting a compensation voltage to obtain a command current, adjusting a lower limit value of an inductor current according to the command current, the lower limit value of an inductor current plus a preset compensation current value to obtain the upper limit value of an inductor current, the switching frequency can be controlled by controlling the preset compensation current to achieve fixed frequency.

2. The control method for the switch circuit according to claim 1, further comprising following steps:

after sampling the inductor current in the circuit to obtain a sampling current, determining whether the sampling current is smaller than zero, and if yes, switching off a synchronous rectifier in the circuit.

3. The control method for the switch circuit according to claim 1, further comprising following steps:

after sampling the inductor current in the circuit to obtain a sampling current, determining whether the sampling current is smaller than zero, and if yes, switching off a synchronous rectifier in the circuit.

4. The control method for the switch circuit according to claim 1, further comprising following steps:

after sampling the inductor current in the circuit to obtain a sampling current, determining whether the sampling current is smaller than zero, and if yes, switching off a synchronous rectifier in the circuit.

5. A control circuit for a switch circuit, comprising a command current acquiring circuit, an adjuster, an inductor current control circuit, and a drive circuit; wherein the command current acquiring circuit is configured to detect an output voltage or an output current in a circuit, convert the output voltage or the output current into a command current, and output the command current to the adjuster;

the adjuster is configured to adjust an upper limit value or a lower limit value of an inductor current according to the command current and a preset compensation current value; and the inductor current control circuit is connected with the adjuster, the drive circuit, and a sampling terminal of the inductor current; the inductor current control circuit is configured to sample the inductor current to obtain a sampling current, generate a switching signal according to the sampling current and the upper limit value and the lower limit value of the inductor current, and control a main switch transistor by the drive circuit, the main switch transistor is controlled to be switched off when the sampling current rises to the upper limit value of the inductor current, and the main switch transistor is controlled to be switched on when the sampling current drops to the lower limit value of the inductor current;

wherein converting a compensation voltage to obtain a command current, adjusting a lower limit value of an inductor current according to the command current, the lower limit value of an inductor current plus a preset compensation current value to obtain the upper limit value of an inductor current, the switching frequency can be controlled by controlling the preset compensation current to achieve fixed frequency.

6. The control circuit for the switch circuit according to claim 5, wherein the command current acquiring circuit comprises a load voltage sampling unit, a voltage comparing unit, and a voltage-to-current converting unit;

the load voltage sampling unit is connected with the voltage comparing unit and the voltage-to-current converting unit in sequence; and the load voltage sampling unit is configured to sample a voltage between two ends of a load to obtain a sampling voltage, and output the sampling voltage to the voltage comparing unit; and the voltage comparing unit is configured to compare the sampling voltage with a preset reference voltage, output a voltage signal obtained by comparison to the voltage-to-current converting unit for conversion to obtain a command current, and output the command current to the adjuster.

7. The control circuit for the switch circuit according to claim 5, wherein the adjuster is an adder or a subtracter;

a first input terminal of the adder or the subtracter is connected with an output terminal of a voltage-to-current converting unit, a second input terminal of the adder or the subtracter is connected with a preset compensation current value, and an output terminal of the adder or the subtracter is connected with the inductor current control circuit.

8. The control circuit for the switch circuit according to claim 7, wherein when the adjuster is the adder, the command current is the lower limit value of the inductor current; and when the adjuster is the subtracter, the command current is the upper limit value of the inductor current.

9. The control circuit for the switch circuit according to claim 5, wherein the inductor current control circuit comprises a zero-crossing comparison circuit; and the zero-crossing comparison circuit is configured to determine whether the sampling current is smaller than zero, and output a control signal to switch off a synchronous rectifier when the sampling current is determined to be smaller than zero.

10. The control circuit for the switch circuit according to claim 6, wherein the inductor current control circuit comprises a zero-crossing comparison circuit; and the zero-crossing comparison circuit is configured to determine whether the sampling current is smaller than zero, and output a control signal to switch off a synchronous rectifier when the sampling current is determined to be smaller than zero.

11. A switching-mode power supply circuit, comprising an inductor and a main switch transistor, and further comprising the control circuit for the switch circuit according to claim 5.

12. A switching-mode power supply circuit, comprising an inductor and a main switch transistor, and further comprising the control circuit for the switch circuit according to claim 6.

13. A switching-mode power supply circuit, comprising an inductor and a main switch transistor, and further comprising the control circuit for the switch circuit according to claim 7.

* * * * *